United States Patent
Kobayashi (10) Patent No.: US 11,981,356 B2
(45) Date of Patent: May 14, 2024

(54) TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 979 days.

(21) Appl. No.: 16/960,979

(22) PCT Filed: Dec. 7, 2018

(86) PCT No.: PCT/JP2018/045151
§ 371 (c)(1),
(2) Date: Jul. 9, 2020

(87) PCT Pub. No.: WO2019/146278
PCT Pub. Date: Aug. 1, 2019

(65) Prior Publication Data
US 2020/0339162 A1    Oct. 29, 2020

(30) Foreign Application Priority Data

Jan. 24, 2018  (JP) ................. 2018-009962

(51) Int. Cl.
| | | |
|---|---|---|
| *H01L 21/67* | (2006.01) | |
| *B61B 3/02* | (2006.01) | |
| *B65G 1/04* | (2006.01) | |
| *B66C 11/06* | (2006.01) | |
| *H01L 21/677* | (2006.01) | |

(52) U.S. Cl.
CPC .............. *B61B 3/02* (2013.01); *B65G 1/0457* (2013.01); *B66C 11/06* (2013.01); *B65G 2201/0297* (2013.01); *H01L 21/67733* (2013.01)

(58) Field of Classification Search
CPC .......... B65G 1/0457; B65G 2201/0297; B66C 11/06; H01L 21/67733; H01L 21/67706; H01L 21/67386
See application file for complete search history.

(56) References Cited

U.S. PATENT DOCUMENTS 7,845,284 B2 * 12/2010  Izumi ............... H01L 21/67259
                                                               104/88.02
8,490,802 B2 *  7/2013  Honda .............. H01L 21/6773
                                                                    212/331

(Continued)

*Primary Examiner* — Ronald P Jarrett
(74) *Attorney, Agent, or Firm* — Keating & Bennett, LLP (57) ABSTRACT

An overhead transport vehicle includes a container accommodation portion sandwiched by a pair of cover portions in a front-and-rear direction in a traveling direction and configured to hold a cassette in a state in which a lid faces in a width direction intersecting the traveling direction and a vertical direction; and a lid-fall prevention member on the cover portion to prevent the lid that has come off from the cassette held in the container accommodation portion from falling. The lid-fall prevention member includes a lower support portion extending along the width direction below the cassette and partially protruding from the lid in a planar view seen from the vertical direction, and a front support portion standing upright in the vertical direction from the lower support portion so as to face at least a portion of the lid. The lower support portion and the front support portion are integrally defined by a unitary structure.

16 Claims, 9 Drawing Sheets

(56) References Cited

U.S. PATENT DOCUMENTS

| | | | |
|---|---|---|---|
| 9,312,158 B2 * | 4/2016 | Wada | B66C 19/00 |
| 10,497,595 B2 * | 12/2019 | Kobayashi | H01L 21/67288 |
| 2011/0062103 A1 | 3/2011 | Honda et al. | |

* cited by examiner

TRANSPORT VEHICLE

BACKGROUND OF THE INVENTION

1. Field of the Invention

One aspect of the present invention relates to a transport vehicle.

2. Description of the Related Art

An overhead transport vehicle that travels near the ceiling or a position higher than a floor surface of a cleanroom and the like and transports a container accommodating semiconductor wafers, reticles, liquid crystal substrates, or the like has been known. As such an overhead transport vehicle, for example, Japanese Patent No. 5035415 discloses an overhead transport vehicle that includes a lid-fall prevention member arranged close to the front of a lid of the container and a retraction mechanism configured to retract the lid-fall prevention member from the front of the lid when the container is raised or lowered.

SUMMARY OF THE INVENTION

The transport vehicle that transports a container including the above-described conventional overhead transport vehicle is configured such that the lid-fall prevention member is arranged at a position slightly away (by providing a gap) from the lid so that the container does not come in contact with the lid-fall prevention member when the lid-fall prevention member is positioned at the front of the lid. However, if the gap is increased or the thickness of the lid of the container is thinned, the lid that has come off from the container may fall through the gap.

Thus, preferred embodiments of the present invention provide transport vehicles each capable of more reliably preventing falling of the lid that has come off from the container.

A transport vehicle according to one aspect of a preferred embodiment of the present invention is a transport vehicle configured to transport a container including a lid covering an opening, and the transport vehicle includes a container accommodation portion sandwiched by cover portions provided in a front-and-rear direction in a traveling direction and configured to hold the container in a state in which the lid faces in a width direction intersecting the traveling direction and a vertical direction, and a lid-fall prevention member provided on the cover portion and configured to prevent the lid that has come off from the container held in the container accommodation portion from falling, and the lid-fall prevention member includes a lower support portion extending along the width direction below the container and partially protruding from the lid in a planar view seen from the vertical direction, and a front support portion standing upright in the vertical direction from the lower support portion so as to face at least a portion of the lid. The lower support portion and the front support portion are integrally defined by a unitary structure.

With the transport vehicle of this configuration, because the front support portion is arranged in front of the lid, the lid falling forward from the container can be caught. In addition, even if the distance (gap) between the lid and the front support portion is increased in order to reduce or prevent contact when the container sways, the lower support portion provided between the front support portion and the container can catch the lid that has come off from the container. As a result, the fall of the lid is prevented more reliably.

In a transport vehicle according to one aspect of a preferred embodiment of the present invention, the front support portion may extend to an upper end of the lid in the vertical direction. With this configuration, because the upper portion of the lid can be prevented from greatly tilting forward, the lid that has come off from the container can be prevented from falling passing through the gap between the lower support portion and the lower surface of the container. Thus, by the lid-fall prevention member including the lower support portion and the front support portion, the falling of the lid is prevented more reliably.

In a transport vehicle according to one aspect of a preferred embodiment of the present invention, the lid-fall prevention member may further include a back support portion positioned to sandwich the lid and face the front support portion, in a planar view seen from the vertical direction, and standing upright in the vertical direction from lower support portion, and the lower support portion, the front support portion, and the back support portion may be integrally defined by a unitary structure. With this configuration, because the back support portion catches the lid that has come off from the container and been about to fall from the gap between the lower support portion and the lower surface of the container, the lid can be prevented from falling from the container more reliably.

A transport vehicle according to one aspect of a preferred embodiment of the present invention may further include a driver mechanism configured to move, by assuming that a position, at which the lower support portion is arranged below the container and the front support portion is arranged in front of the lid, is an advanced position and that a position, at which the lower support portion is retracted from below the container and the front support portion is retracted from the front of the lid, is a retracted position, the lid-fall prevention member between the advanced position and the retracted position. With this configuration, because the lid-fall prevention member can be retracted to the retracted position, the lid-fall prevention member does not interfere with a raising and lowering operation.

In a transport vehicle according to one aspect of a preferred embodiment of the present invention, a portion of the lid-fall prevention member at the retracted position may, in the planar view seen from the vertical direction, be located outside an area where the cover portion and the container accommodation portion are located. With this configuration, even when the distance between the cover portion and the container is small, the lid-fall prevention member can be placed easily.

A transport vehicle according to one aspect of a preferred embodiment of the present invention may further include a controller configured to control the advancing-retracting operation of the drive mechanism, and the controller may move the lid-fall prevention member to the advanced position during traveling, even when the container is not held in the container accommodation portion. With the configuration in which a portion of the lid-fall prevention member protrudes from the area of the transport vehicle when the lid-fall prevention member is located in the retracted position, as compared with the case where the lid-fall prevention member is located in the advanced position, the interference area as the transport vehicle expands. In one aspect of a preferred embodiment of the present invention, even with such a configuration, because the transport vehicle travels in a state where the lid-fall prevention member is advanced to the advanced position, the interference area of the transport vehicle during traveling is able to be effectively reduced.

According to preferred embodiments of the present invention, falling of the lid is prevented more reliably.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the accompanying drawings, the following describes preferred embodiments of the present invention in detail. In the description of the drawings, identical elements will be denoted by identical reference signs and redundant explanations will be omitted.

Figure 1:
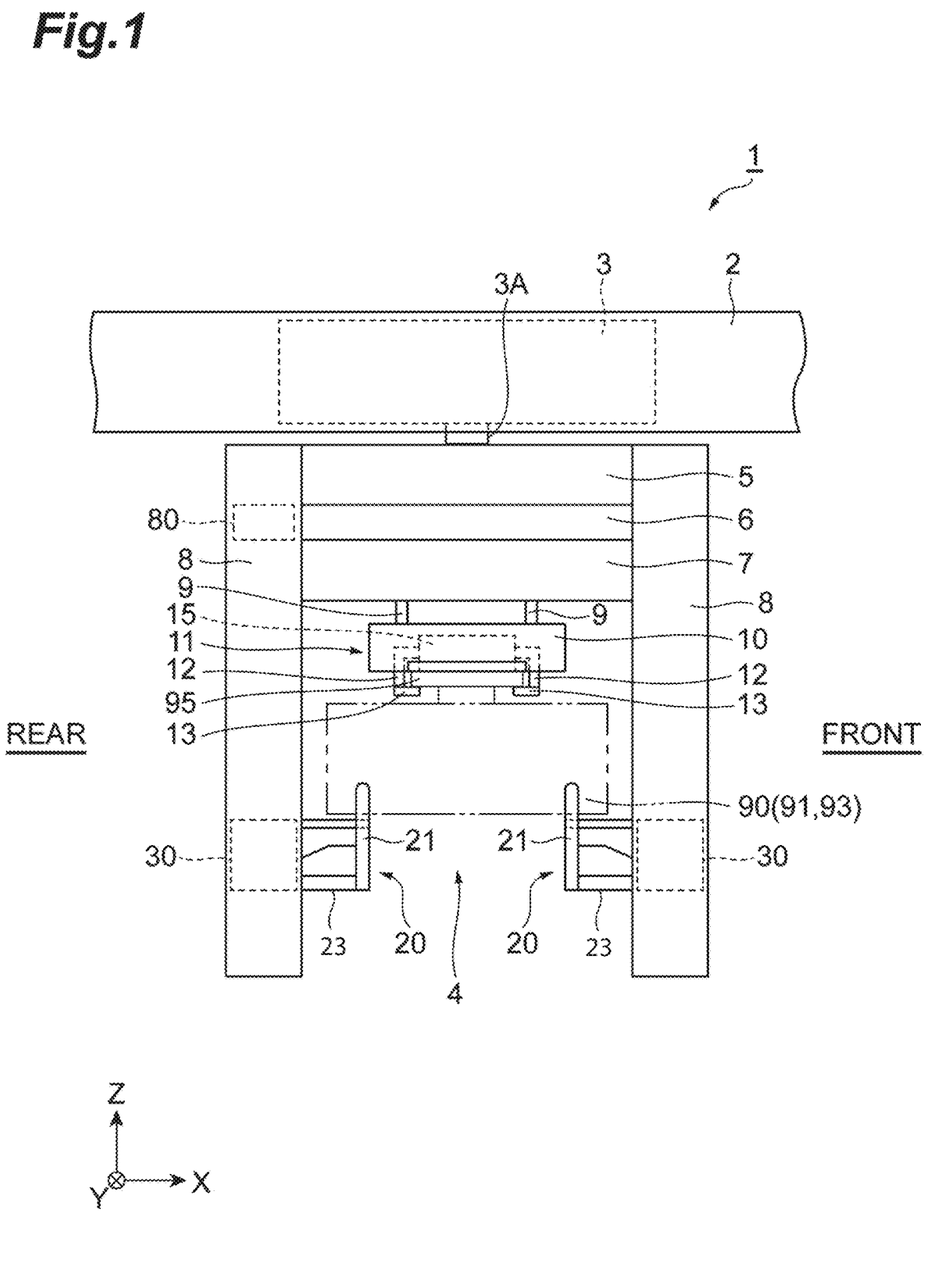
FIG. 1 is a front view illustrating an overhead transport vehicle according to a preferred embodiment of the present invention.

An overhead transport vehicle (transport vehicle) 1 illustrated in FIG. 1 travels along a traveling rail 2 provided at a position higher than the floor surface such as the ceiling and the like of a cleanroom. The overhead transport vehicle 1 transports a cassette (container) 90 as a transported object, between a storage facility and a predetermined load port, for example. The cassette 90 has a box-shaped housing 91 having an opening, and a lid 93 covering the opening. The lid 93 is detachably provided with respect to the housing 91. In the cassette 90, a plurality of reticles and the like are accommodated, for example. The cassette 90 includes a flange 95 that is held by the overhead transport vehicle 1.

In the following description, for the sake of convenience of description, the left-and-right direction (X-axis direction) in FIG. 1 is defined as the front-and-rear direction (traveling direction) of the overhead transport vehicle 1. The up-and-down direction in FIG. 1 is defined as the vertical direction (Z-axis direction) of the overhead transport vehicle 1. The depth direction in FIG. 1 is defined as the width direction (Y-axis direction) of the overhead transport vehicle 1. The X-axis, Y-axis, and Z-axis are orthogonal to one another.

As illustrated in FIG. 1, the overhead transport vehicle 1 includes a traveling drive unit 3, a horizontal drive unit 5, a rotation drive unit 6, an elevating drive unit 7, an elevating device 10, a holding device 11, lid-fall prevention members 20, drive mechanisms 30 for the lid-fall prevention members 20, and a controller (control unit) 80. The overhead transport vehicle 1 is provided with a pair of cover portions 8 and 8 so as to cover the horizontal drive unit 5, the rotation drive unit 6, the elevating drive unit 7, the elevating device 10, and the holding device 11 from the front-and-rear direction. The pair of cover portions 8 and 8 define a container accommodation portion 4 as a space in which the cassette 90 is accommodated below the holding device 11 in a state where the elevating device 10 is raised to an elevating end. In the container accommodation portion 4, the cassette 90 is held in a state where the lid 93 faces in the Y-axis direction that intersects with the X-axis direction and the Z-axis direction. That is, the holding device 11 holds the cassette 90 in a state where the lid 93 faces in the Y-axis direction.

The traveling drive unit 3 moves the overhead transport vehicle 1 along the traveling rail 2. The traveling drive unit 3 is arranged in the traveling rail 2. The traveling drive unit 3 drives a roller (not depicted) that travels on the traveling rail 2. In the lower portion of the traveling drive unit 3, the horizontal drive unit 5 is coupled to via a shaft 3A. The horizontal drive unit 5 moves, in the horizontal plane, the rotation drive unit 6, the elevating drive unit 7, and the elevating device in the Y-axis direction that is orthogonal to an extending direction of the traveling rail 2. The rotation drive unit 6 rotates, in the horizontal plane, the elevating drive unit 7 and the elevating device 10. The elevating drive unit 7 raises and lowers the elevating device 10 by winding and unwinding four belts 9, for example. The traveling drive unit 3 may include a linear motor and the like that generates propulsion on the overhead transport vehicle 1. The belts 9 in the elevating drive unit 7 may use hanging members such as wires, ropes, and the like, as appropriate.

The elevating device 10 in the present preferred embodiment is capable of being raised and lowered by the elevating drive unit 7, and functions as an elevating platform in the overhead transport vehicle 1. The holding device 11 holds the cassette 90. The holding device 11 includes a pair of L-shaped arms 12 and 12, hands 13 and 13 fixed to each of the arms 12 and 12, and an opening and closing mechanism 15 that opens and closes the pair of arms 12 and 12.

The pair of arms 12 and 12 is coupled to the opening and closing mechanism 15. The opening and closing mechanism 15 moves the pair of arms 12 and 12 in a direction to approach each other and a direction to separate from each other. By the operation of the opening and closing mechanism 15, the pair of arms 12 and 12 advances and retracts in the front-and-rear direction. As a result, the pair of hands 13 and 13 fixed to the arms 12 and 12 opens and closes. In the present preferred embodiment, the height position of the holding device 11 (elevating device 10) is adjusted so that, when the pair of hands 13 and 13 is in an opened state, the holding surfaces of the hands 13 are lower than the height of the lower surface of the flange 95. Then, as the pair of hands 13 and 13 are in a closed state in this situation, the holding surfaces of the hands 13 and 13 advance below the lower portion of the lower surface of the flange 95, and by raising the elevating device 10 in this situation, the flange 95 is held by the pair of hands 13 and 13 and the cassette 90 is supported.

Figure 2:
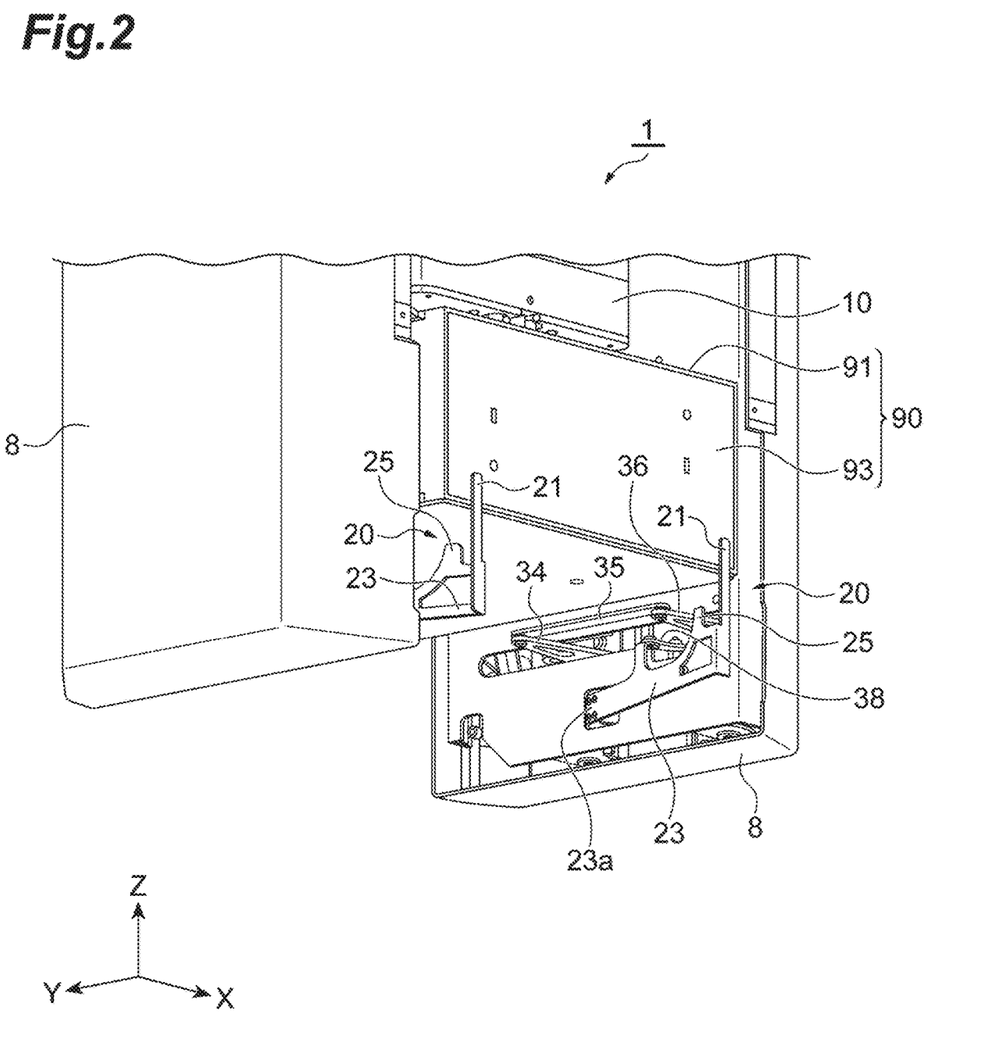
FIG. 2 is a perspective view when a lid-fall prevention member in FIG. 1 is located in an advanced position.
Figure 3:
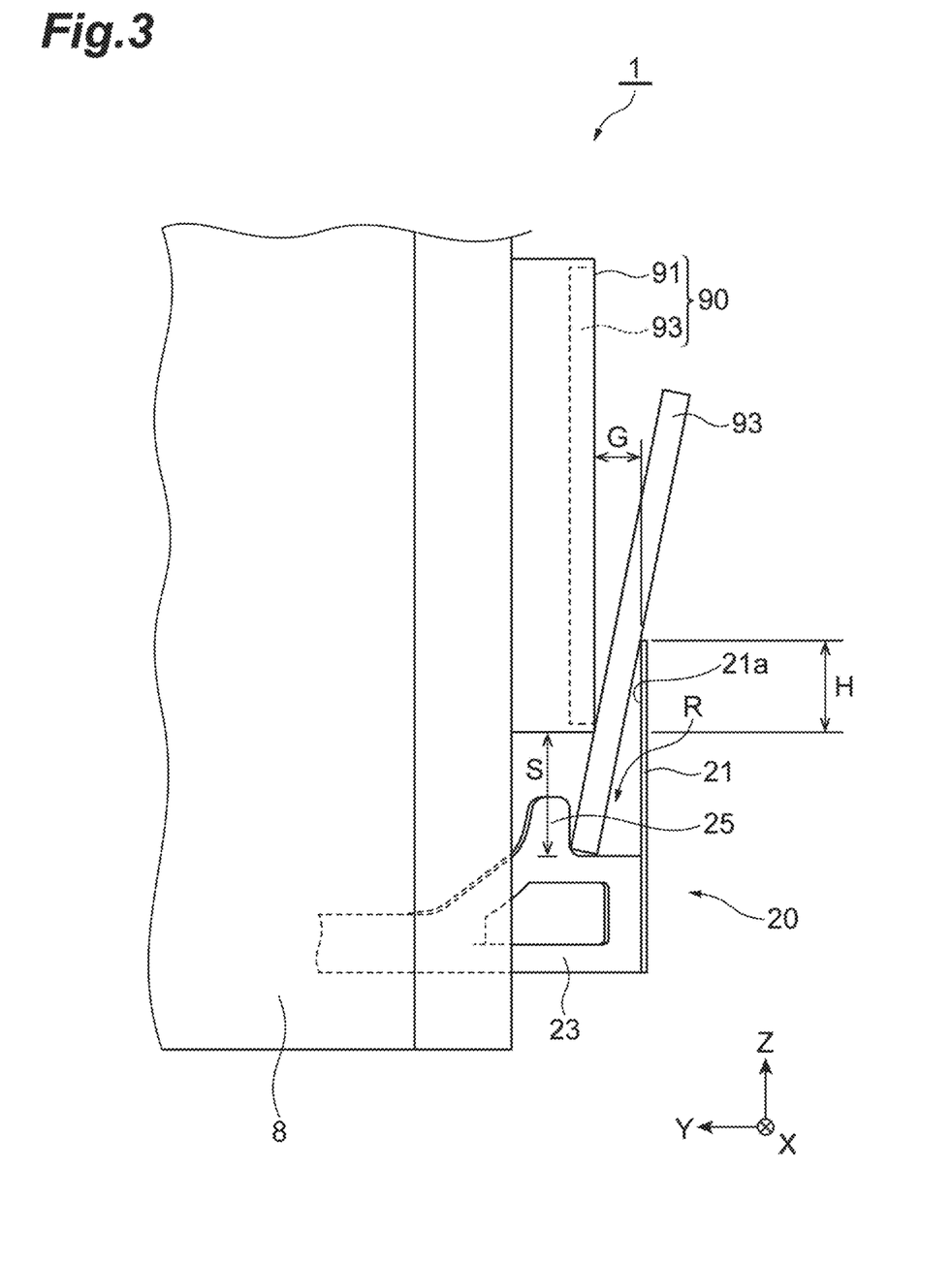
FIG. 3 is a side view when the lid-fall prevention member in FIG. 1 is located in the advanced position.

As illustrated in FIG. 2 and FIG. 3, the lid-fall prevention member 20 is provided on each of the pair of cover portions 8 and 8 and prevents the fall of the lid 93 that has come off from the cassette 90 held by the holding device 11 in the container accommodation portion 4. The lid-fall prevention member 20 includes a lower support portion 23, a front support portion 21, and a back support portion 25. The lower support portion 23 is a plate-shaped structure. The lower support portion 23 is arranged, when the overhead transport vehicle 1 travels, so as to extend along the Y-axis direction below the cassette 90 and to partially protrude from the lid 93 in a planar view seen from the Z-axis direction. The front support portion 21 is a plate-shaped structure that stands upright in the Z-axis direction from the lower support portion 23 and is arranged so as to face at least a portion of the lid 93 of the cassette 90 when the overhead transport vehicle 1 travels. The front support portion 21 is arranged at a position approximately 10 mm to 20 mm away from the lid 93 arranged in a state of covering the housing 91, for example. Overlap H between the lid 93 and the front support portion 21 in the Z-axis direction can be approximately 30 mm, for example. The above-described distance G and the overlap H are set based on the size and thickness of the lid 93, the configuration of the drive mechanism 30, or the like, as appropriate.

On the backside of the front support portion 21 that faces the lid 93, a sliding member 21a such as an ultra-high molecular weight polyethylene tape and the like is affixed. This can enhance the sliding when supporting the lid 93 and prevent the lid 93 from being scratched. The back support portion 25 is a plate-shaped structure and is arranged so as to face the front support portion 21 and stands upright in the Z-axis direction from the lower support portion 23. The back support portion 25 is arranged so as to face the front support portion 21 across the lid 93 of the cassette 90 in lateral view seen from the Y-axis direction, or in a planar view seen from the Z-axis direction.

Figure 4:
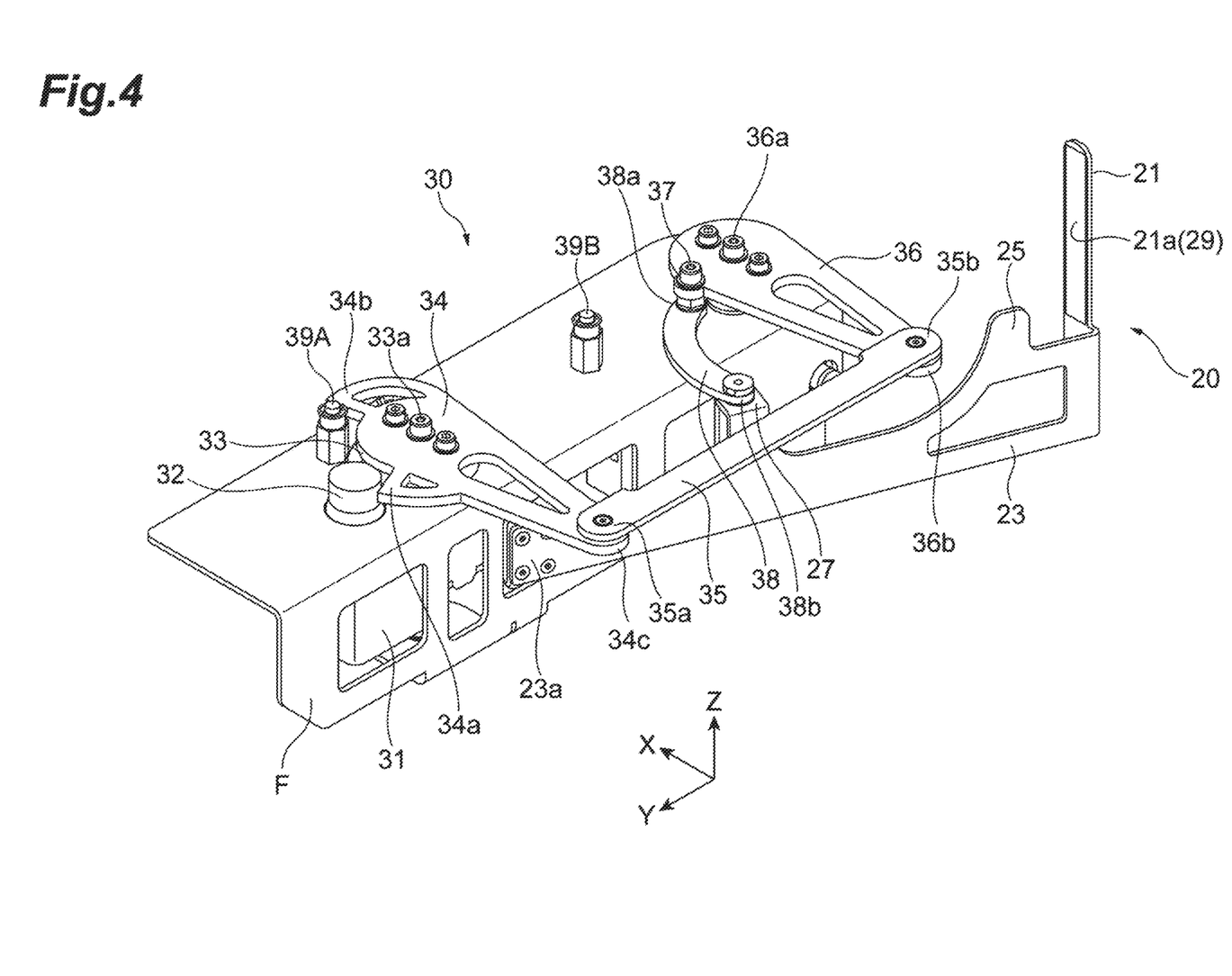
FIG. 4 is a perspective view of a drive mechanism when the lid-fall prevention member is located in the advanced position.

The lower support portion 23, the front support portion 21, and the back support portion 25 are integrally formed by bending a plate-shaped structure such as stainless steel. The lid-fall prevention member 20 is provided so as to be movable between an advanced position P1 and a retracted position P2 by the drive mechanism 30 illustrated in FIG. 4. In the following description, when specifying the positions of the members and the like, the description is made with reference to the cassette 90 in a state of being held by the holding device 11 in the container accommodation portion 4, unless otherwise specifically noted.

Figure 5A:
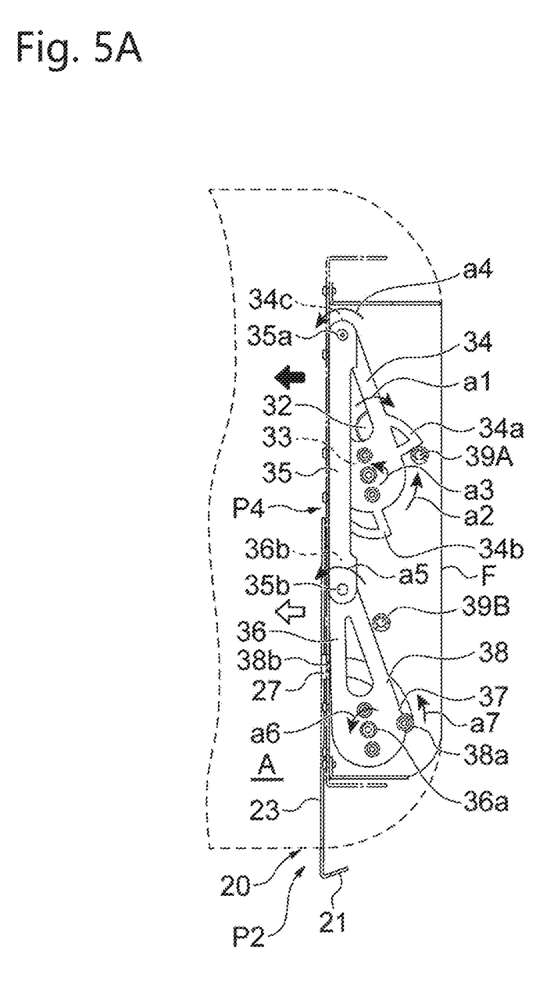
FIGS. 5A and 5B are transition diagrams of the drive mechanism when the lid-fall prevention member in FIG. 1 moves from a retracted position to the advanced position.
Figure 5B:
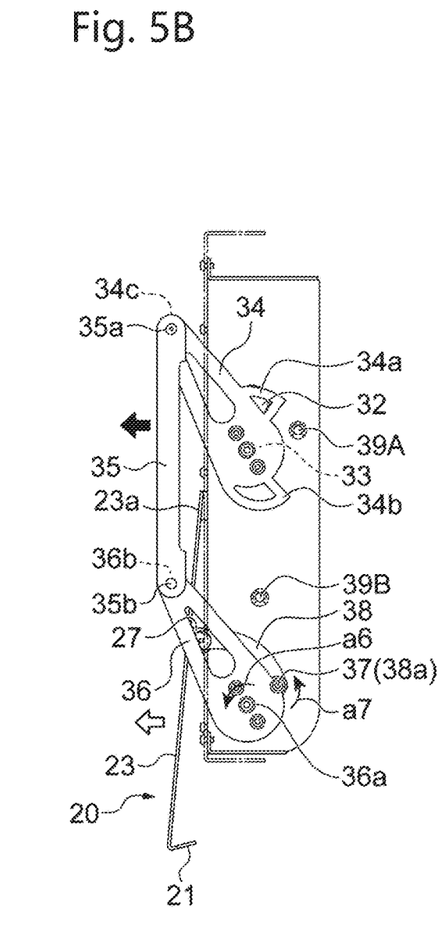

The lower support portion 23 is arranged below the cassette 90 at the advanced position P1 and, at the retracted position P2, is retracted from below the cassette 90. The front support portion 21 is arranged so as to face at least a portion of the lid 93 of the cassette 90 at the advanced position P1 and, at the retracted position P2, is retracted from the front of the lid 93 of the cassette 90 (moved to a position not overlapping with the lid 93 when viewed from the Y-axis direction). The back support portion 25 is arranged so as to face the front support portion 21 across the lid 93 of the cassette 90 in lateral view seen from the front-and-rear direction at the advanced position P1 and, at the retracted position P2, is retracted from the lower back surface of the lid 93 of the cassette 90 (moved to a position not overlapping with the lower back surface of the lid 93 when viewed from the Y-axis direction). A portion of the lid-fall prevention member 20 (a part including the front support portion 21) at the retracted position P2, in a planar view seen from the Z-axis direction, is located outside an area A where the cover portion 8 and the container accommodation portion 4 are arranged (see FIG. 5A).

The drive mechanism 30 of the lid-fall prevention member 20 is accommodated in each of the pair of cover portions 8 and 8. As illustrated in FIG. 4, FIGS. 5A and 5B, FIGS. 6A and 6B, the drive mechanism 30 includes a drive unit 31, a drive shaft 32, a gear unit 33, a first link portion 34, a cassette-fall prevention portion 35, a second link portion 36, and a third link portion 38, and is fixed to a frame F. The drive mechanism 30 converts the rotational motion of the drive unit 31 into an advancing-retracting motion of the cassette-fall prevention portion 35 (reciprocating motion between the advanced position and the retracted position) and an advancing-retracting motion of the lid-fall prevention member 20 (reciprocating motion between the advanced position and the retracted position).

The drive unit 31 includes, for example, a stepping motor and is controlled by the controller 80 (see FIG. 1). On the drive shaft 32 that rotates bidirectionally by the drive unit 31, a gear is provided. The gear unit 33 is provided so as to engage with the gear of the drive shaft 32, and when the drive shaft 32 rotates in an arrow direction a1, also the gear unit 33 rotates in an arrow direction a2. The first link portion 34 is integrally coupled to a rotating shaft 33a of the gear unit 33, and when the gear unit 33 rotates in the arrow direction a2, also the first link portion 34 rotates in an arrow direction a3. In the vicinity of the first link portion 34, a stopper 39A is provided. The first link portion 34 includes a first locking portion 34a and a second locking portion 34b. When the lid-fall prevention member 20 is located in the retracted position P2, the first locking portion 34a is locked by the stopper 39A (see FIG. 5A). When the lid-fall prevention member is located in the advanced position P1, the second locking portion 34b is locked by the stopper 39A (see FIG. 6B).

The cassette-fall prevention portion 35 is a plate-shaped structure extending along the Y-axis direction. One end 35a of the cassette-fall prevention portion 35 is coupled to the other end 34c that is eccentric relative to the rotating shaft 33a of the first link portion 34 so as to be bidirectionally rotatable. The other end 35b of the cassette-fall prevention portion 35 is coupled to the other end 36b that is eccentric relative to a rotating shaft 36a of the second link portion 36 so as to be bidirectionally rotatable. The second link portion 36 is bidirectionally rotatable around the rotating shaft 36a as a base point. In the vicinity of the second link portion 36, a stopper 39B that limits the movable area of the second link portion 36 is provided. When the lid-fall prevention member 20 is located in the retracted position P2, the second link portion 36 is locked by the stopper 39B (see FIG. 5A).

The third link portion 38 at one end 38a is coupled to a rotating shaft 37 arranged at a position that is eccentric to the rotating shaft 36a of the second link portion 36. The other end 38b of the third link portion 38 is coupled to an attaching portion provided on the lower support portion 23 of the lid-fall prevention member 20. A base portion 23a of the lower support portion 23 opposite to an end portion on which the front support portion 21 or the like is provided is attached to the frame F so as to be bidirectionally rotatable via a rotation member (not depicted) that is fixed to the frame F and is bidirectionally rotatable with a shaft extending in the Z-axis direction as a rotation axis. This makes the lower support portion 23 bidirectionally rotatable with the base portion 23a as a rotation axis.

Figure 6A:
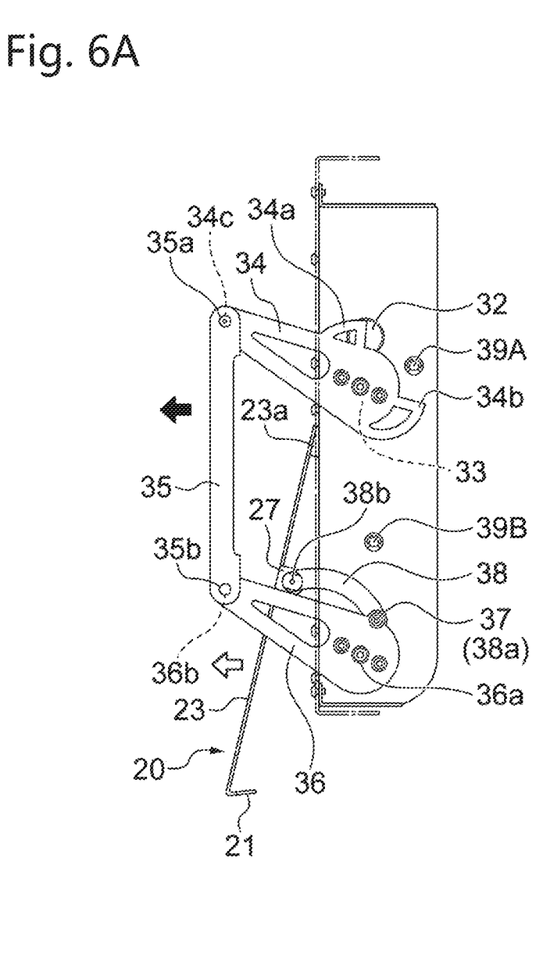
FIG. 6A and FIG. 6B are transition diagrams of the drive mechanism when the lid-fall prevention member in FIG. 1 moves from the retracted position to the advanced position.
Figure 6B:
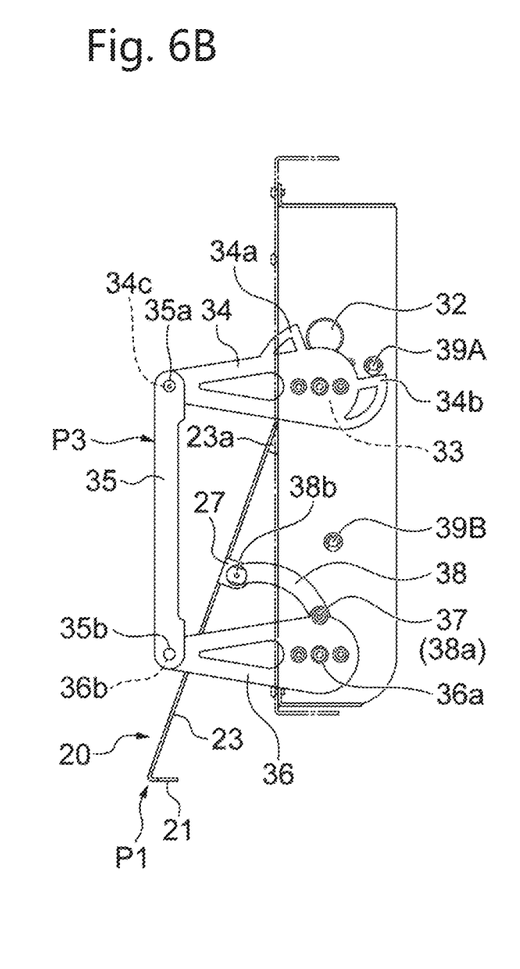

The cassette-fall prevention portion 35 is moved, due to the rotation in an arrow direction a4 of the other end 34c of the first link portion 34 accompanying the rotation of the first link portion 34, in the direction (black arrow direction) from a retracted position P4 (see FIG. 5A) to an advanced position P3 (see FIG. 6B). When the cassette-fall prevention portion 35 is moved in the black arrow direction, the other end 36b of the second link portion 36 that is coupled to the other end 35b of the cassette-fall prevention portion 35 at the location that is eccentric to the rotating shaft 36a of the second link portion 36 rotates in an arrow direction a5. With the rotation of the other end 36b of the second link portion 36 in the arrow direction a5, the second link portion 36 rotates in an arrow direction a6 with the rotating shaft 36a as a base point.

With the rotation of the second link portion 36 in the arrow direction a6, the third link portion 38 rotates with the one end 38a of the third link portion 38 as a base point. When the one end 38a of the third link portion 38 rotates, the one end 38a of the third link portion 38 rotates in an arrow direction a7 and pushes out the lower support portion 23 coupled to the other end 38b of the third link portion 38 in a white arrow direction. As a result, the lid-fall prevention member 20 advances from the retracted position P2 (see FIG. 5A) to the advanced position P1 (see FIG. 6B).

By the above-described series of operations of the drive mechanism 30, the cassette-fall prevention portion 35 coupled to the second link portion 36 advances from the retracted position P4 (see FIG. 5A) to the advanced position P3 (see FIG. 6B) and the lid-fall prevention member 20 coupled to the third link portion 38 advances from the retracted position P2 (see FIG. 5A) to the advanced position P1 (see FIG. 6B). The movement of the cassette-fall prevention portion 35 from the advanced position P3 to the retracted position P4 and the movement of the lid-fall prevention member 20 from the advanced position P1 to the retracted position P2 are performed by the operations in the reverse direction of the above-described series of operations.

Figure 7:
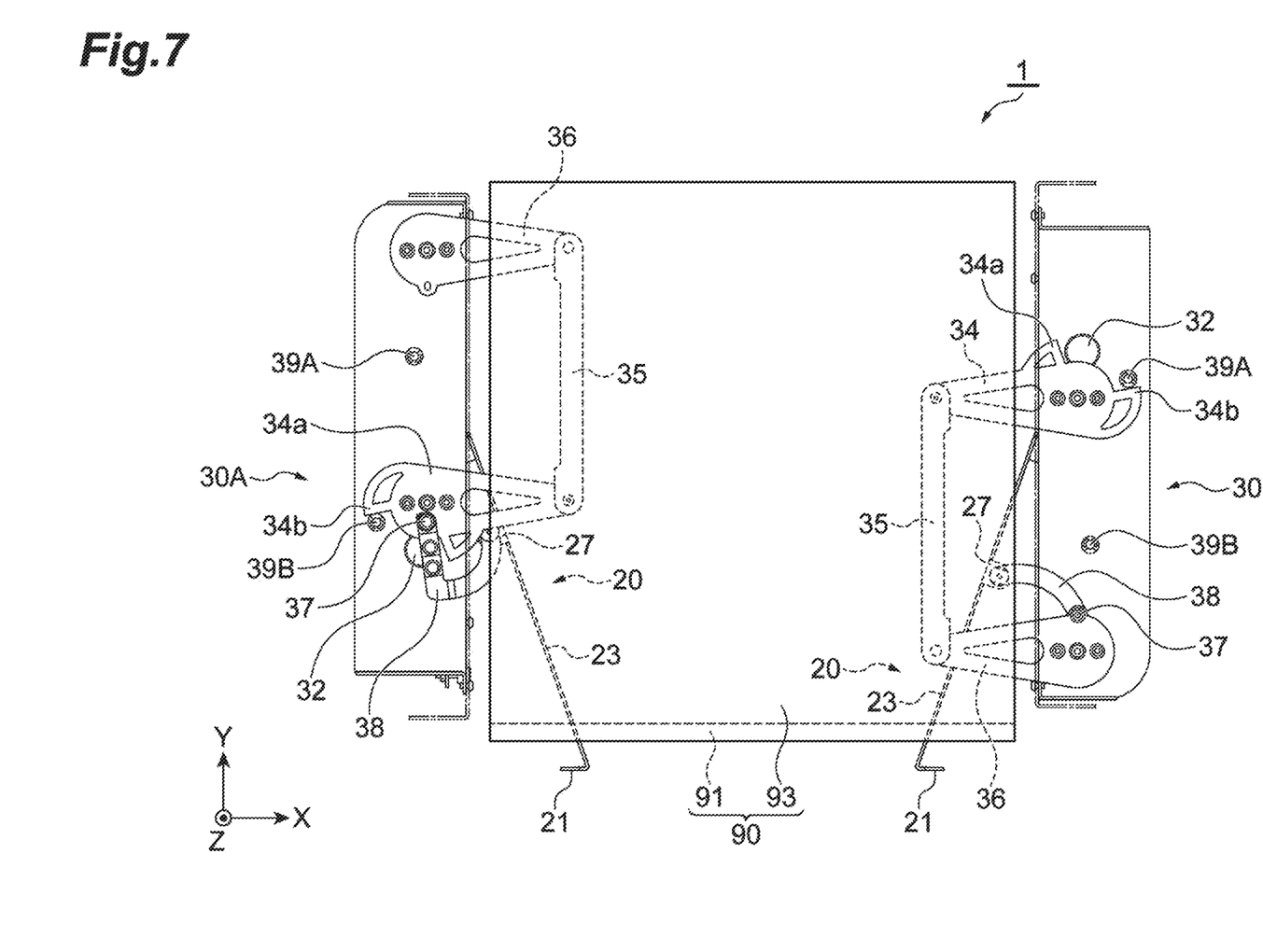
FIG. 7 is a plan view when the lid-fall prevention member is located in the advanced position.

Note that, as illustrated in FIG. 7, the above-described explanation of the drive mechanism 30 has been made with an example of the drive mechanism 30 accommodated in the cover portion 8 on the right-hand side (front side in the traveling direction) in a planar view seen from the Z-axis direction, but the configuration and operation of a drive mechanism 30A accommodated in the cover portion 8 on the left-hand side (the rear side in the traveling direction) in a planar view seen from the Z-axis direction are slightly different from those of the previously described drive mechanism 30. The cassette-fall prevention portion 35 driven by the drive mechanism 30 and a cassette-fall prevention portion 35A driven by the drive mechanism 30A, in a planar view seen from the Z-axis direction, operate substantially point-symmetrically to the center point of the cassette 90 as a symmetric point.

The controller 80 (see FIG. 1) controls various portions of the overhead transport vehicle 1. The controller 80 includes a central processing unit (CPU), a random-access memory (RAM), a read-only memory (ROM), and the like. The controller 80 executes various controls by the collaboration of hardware such as the CPU, the RAM, the ROM, and the like, and software such as programs. For example, the controller 80 controls the advancing-retracting operation of the drive mechanism 30 and, even when the cassette 90 is not held in the container accommodation portion 4, makes the overhead transport vehicle 1 travel in a state where the lid-fall prevention member 20 is moved to the advanced position P1 during traveling.

In the overhead transport vehicle 1 of the above-described preferred embodiment, as illustrated in FIG. 3, because the front support portion 21 is in front of the lid 93, the lid 93 falling forward from the housing 91 of the cassette 90 can be caught. In addition, even if the distance G between the lid 93 and the front support portion 21 is secured to some extent in order to reduce or prevent contact when the cassette 90 sways, the lower support portion 23 provided between the front support portion 21 and the container of the cassette 90 can catch the lid 93 that has come off from the housing 91. As a result, the fall of the lid 93 is prevented more reliably.

In the overhead transport vehicle 1 of the above-described preferred embodiment, as illustrated in FIG. 3, in a planar view seen from the Z-axis direction, the lid-fall prevention member 20 is positioned to sandwich the lid 93 and face the front support portion 21, and the back support portion 25 that stands upright in the Z-axis direction from the lower support portion 23 is provided. This defines a recessed portion R by the front support portion 21, the lower support portion 23, and the back support portion 25, in a lateral view seen from the front-and-rear direction. Thus, the back support portion 25 catches the lid 93 that falls passing through a gap S between the lower support portion 23 and the lower surface of the cassette 90 that would be formed if the back support portion 25 were not provided. As a result, the lid 93 is prevented from falling from the cassette 90 more reliably.

In the overhead transport vehicle 1 of the above-described preferred embodiment, the lid-fall prevention member 20 is movable between the advanced position P1 and the retracted position P2 by the drive mechanism 30. With this configuration, because the lid-fall prevention member 20 can be retracted to the retracted position P2 in the raising and lowering operation, the lid-fall prevention member 20 does not interfere with the raising and lowering operation.

In the overhead transport vehicle 1 of the above-described preferred embodiment, a portion of the lid-fall prevention member 20 at the retracted position P2, in a planar view seen from the Z-axis direction, is located outside the area A where the cover portion 8 and the container accommodation portion 4 are arranged. This allows it to be configures simply, without increasing the size of the cover portion 8.

In the overhead transport vehicle 1 of the above-described preferred embodiment, because the controller 80 controls the lid-fall prevention member 20 so as to move to the advanced position P1 during traveling even when the cassette 90 is not held in the container accommodation portion 4, the interference area of the traveling overhead transport vehicle 1 can be made small. That is, the possibility of contacting other objects when the overhead transport vehicle 1 is traveling is reduced.

As in the foregoing, preferred embodiments have been described. However, the present invention is not limited to the above-described preferred embodiments, and various modifications are possible within a scope not departing from the spirit of the present invention.

Figure 8:
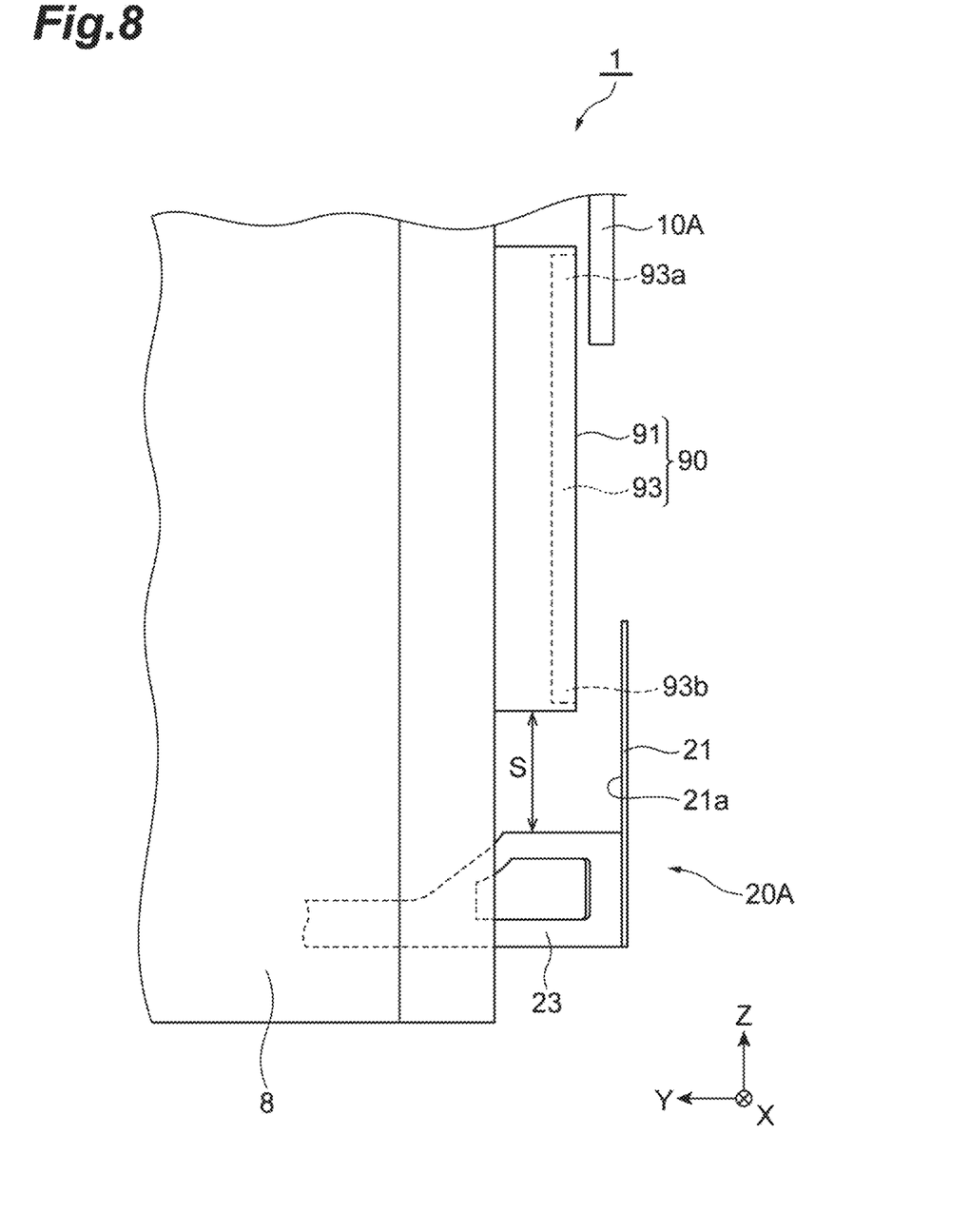
FIG. 8 is a side view when a lid-fall prevention member according to a modification of a preferred embodiment of the present invention is located in the advanced position.

In the overhead transport vehicle 1 of the above-described preferred embodiment, an example in which the back support portion 25 is provided on the lid-fall prevention member 20 has been described. However, the lid-fall prevention member 20 not provided with the back support portion 25 may be used. In this case, as illustrated in FIG. 8, a lid-holding member 10A that is provided on the elevating device 10 and arranged on the upper front of the lid 93 of the cassette 90 may be included. In this case, because the upper-end 93a of the lid 93 is prevented from falling forward, the fall of the lid 93 to the lower support portion 23 in a state in which the lower end 93b of the lid 93 is tilted toward the gap S side between the lower support portion 23 and the lower surface of the cassette 90 is reduced. As a result, even if the back support portion 25 is not provided, the lid 93 that has come off from the cassette 90 is prevented from falling passing through the gap S.

Figure 9:
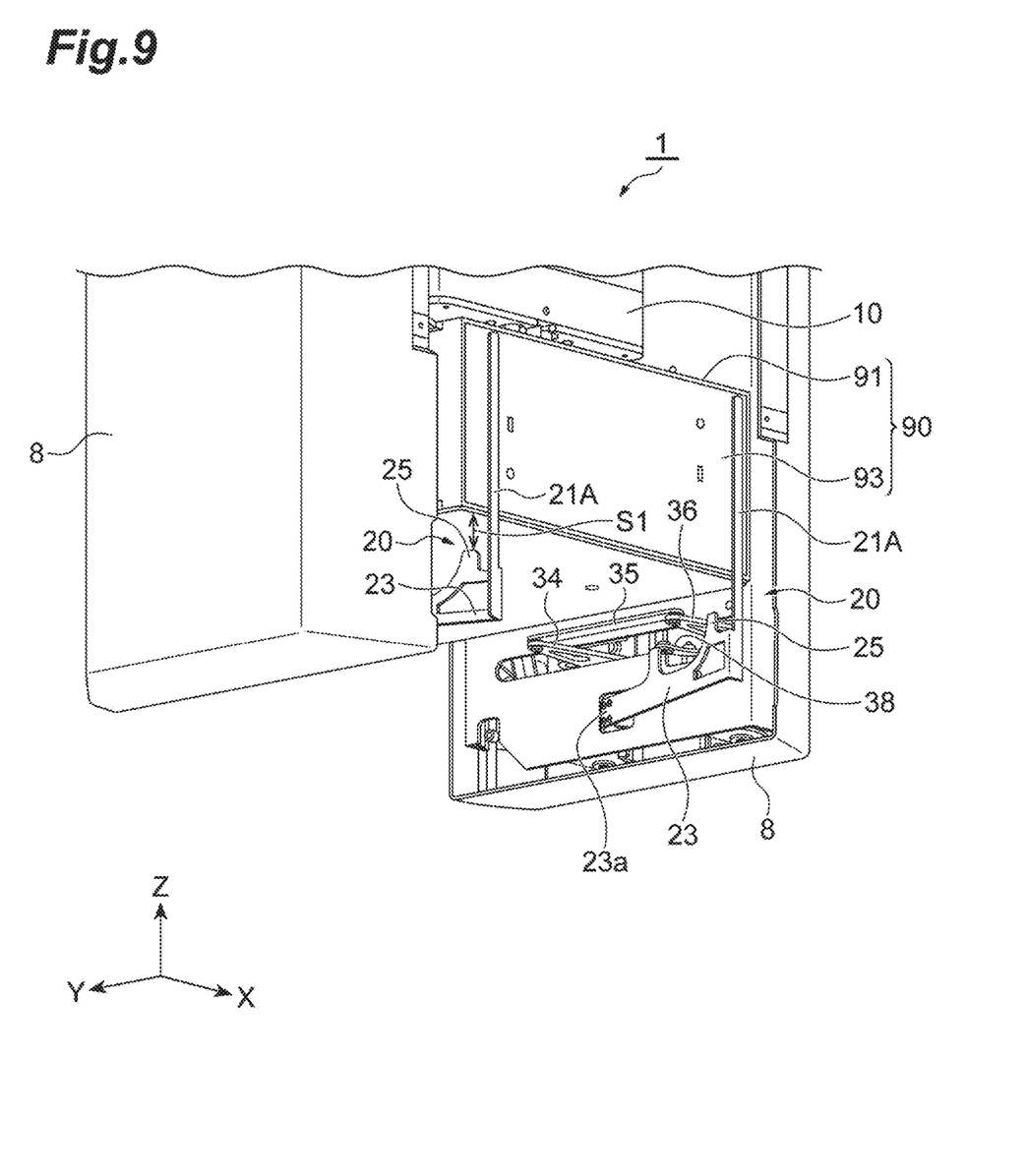
FIG. 9 is a perspective view when a lid-fall prevention member in a modification of a preferred embodiment of the present invention is located in the advanced position.

In the above-described preferred embodiment, an example in which the front support portion 21 arranged to face at least a portion of the lid 93 of the cassette 90 when the overhead transport vehicle 1 travels has been described. However, as illustrated in FIG. 9, the front support portion 21 may extend to the upper end of the lid 93 in the Z-axis direction. With this configuration, because the upper portion of the lid 93 can be prevented from tilting forward, the lid 93 that has come off from the housing 91 can be prevented from falling passing through a gap S1 between the lower support portion 23 and the lower surface of the cassette 90. As a result, the fall of the lid 93 is prevented more reliably.

In the above-described preferred embodiments, an example in which the controller 80 that makes the overhead transport vehicle travel in a state in which, when traveling, the lid-fall prevention member 20 is moved to the advanced position P1, even when the cassette 90 is not held in the container accommodation portion 4, is provided inside the cover portion 8 has been described. However, it may be configured as a transport vehicle system that includes a control device (control unit) that is provided at a place separate from the overhead transport vehicle 1 and controls the overhead transport vehicle 1 via a network or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport vehicle configured to transport a container including a lid covering an opening, the transport vehicle comprising:
    a container accommodation portion sandwiched by cover portions provided in a front-and-rear direction in a traveling direction and configured to hold the container in a state in which the lid faces in a width direction intersecting the traveling direction and a vertical direction; and
    a lid-fall prevention member provided on the cover portion and configured to prevent the lid that has come off from the container held in the container accommodation portion from falling; wherein
    the lid-fall prevention member includes:
        a lower support portion extending along the width direction below the container and partially protruding from the lid in a planar view seen from the vertical direction; and
        a front support portion standing upright in the vertical direction from the lower support portion so as to face at least a portion of the lid; and
    the lower support portion and the front support portion are integrally defined by a unitary structure.

2. The transport vehicle according to claim 1, wherein the front support portion extends to an upper end of the lid in the vertical direction.

3. The transport vehicle according to claim 2, wherein
    the lid-fall prevention member further includes a back support portion positioned to sandwich the lid and face the front support portion, in a planar view seen from the vertical direction, and standing upright in the vertical direction from lower support portion; and
    the lower support portion, the front support portion, and the back support portion are integrally defined by the unitary structure.

4. The transport vehicle according to claim 3, further comprising a drive mechanism configured to move, by assuming that a position, at which the lower support portion is below the container and the front support portion is in front of the lid, is an advanced position and that a position, at which the lower support portion is retracted from below the container and the front support portion is retracted from the front of the lid, is a retracted position, the lid-fall prevention member between the advanced position and the retracted position.

5. The transport vehicle according to claim 4, wherein a portion of the lid-fall prevention member at the retracted position, in a planar view seen from the vertical direction, is located outside an area where the cover portion and the container accommodation portion are located.

6. The transport vehicle according to claim 5, further comprising a controller configured to control the advancing-retracting operation of the drive mechanism; wherein
    the controller moves the lid-fall prevention member to the advanced position during traveling, even when the container is not held in the container accommodation portion.

7. The transport vehicle according to claim 2, further comprising a drive mechanism configured to move, by assuming that a position, at which the lower support portion is below the container and the front support portion is in front of the lid, is an advanced position and that a position, at which the lower support portion is retracted from below the container and the front support portion is retracted from the front of the lid, is a retracted position, the lid-fall prevention member between the advanced position and the retracted position.

8. The transport vehicle according to claim 7, wherein a portion of the lid-fall prevention member at the retracted position, in a planar view seen from the vertical direction, is located outside an area where the cover portion and the container accommodation portion are located.

9. The transport vehicle according to claim 8, further comprising a controller configured to control the advancing-retracting operation of the drive mechanism; wherein
    the controller moves the lid-fall prevention member to the advanced position during traveling, even when the container is not held in the container accommodation portion.

10. The transport vehicle according to claim 1, wherein
    the lid-fall prevention member further includes a back support portion positioned to sandwich the lid and face the front support portion, in a planar view seen from the vertical direction, and standing upright in the vertical direction from lower support portion; and
    the lower support portion, the front support portion, and the back support portion are integrally defined by the unitary structure.

11. The transport vehicle according to claim 10, further comprising a drive mechanism configured to move, by assuming that a position, at which the lower support portion is below the container and the front support portion is in front of the lid, is an advanced position and that a position, at which the lower support portion is retracted from below the container and the front support portion is retracted from the front of the lid, is a retracted position, the lid-fall prevention member between the advanced position and the retracted position.

12. The transport vehicle according to claim 11, wherein a portion of the lid-fall prevention member at the retracted position, in a planar view seen from the vertical direction, is located outside an area where the cover portion and the container accommodation portion are located.

13. The transport vehicle according to claim 12, further comprising a controller configured to control the advancing-retracting operation of the drive mechanism; wherein the controller moves the lid-fall prevention member to the advanced position during traveling, even when the container is not held in the container accommodation portion.

14. The transport vehicle according to claim 1, further comprising a drive mechanism configured to move, by assuming that a position, at which the lower support portion is below the container and the front support portion is in front of the lid, is an advanced position and that a position, at which the lower support portion is retracted from below the container and the front support portion is retracted from the front of the lid, is a retracted position, the lid-fall prevention member between the advanced position and the retracted position.

15. The transport vehicle according to claim 14, wherein a portion of the lid-fall prevention member at the retracted position, in a planar view seen from the vertical direction, is located outside an area where the cover portion and the container accommodation portion are located.

16. The transport vehicle according to claim 15, further comprising a controller configured to control the advancing-retracting operation of the drive mechanism; wherein the controller moves the lid-fall prevention member to the advanced position during traveling, even when the container is not held in the container accommodation portion.

* * * * *